(12) United States Patent
Dunphy et al.

(10) Patent No.: US 9,639,214 B2
(45) Date of Patent: May 2, 2017

(54) UTILIZING CHIP-ON-GLASS TECHNOLOGY TO JUMPER ROUTING TRACES

(71) Applicant: Synaptics Incorporated, San Jose, CA (US)

(72) Inventors: Jim Dunphy, San Jose, CA (US); Joseph Kurth Reynolds, Alviso, CA (US)

(73) Assignee: Synaptics Incorporated, San Jose, CA (US)

( * ) Notice: Subject to any disclaimer, the term of this patent is extended or adjusted under 35 U.S.C. 154(b) by 518 days.

(21) Appl. No.: 13/947,617

(22) Filed: Jul. 22, 2013

(65) Prior Publication Data

US 2015/0022989 A1  Jan. 22, 2015

(51) Int. Cl.
| | | |
|---|---|---|
| *H05K 1/02* | (2006.01) | |
| *H05K 1/03* | (2006.01) | |
| *H05K 3/46* | (2006.01) | |
| *G06F 3/044* | (2006.01) | |
| *H05K 1/11* | (2006.01) | |
| *H05K 3/22* | (2006.01) | |

(52) U.S. Cl.
CPC ............ *G06F 3/044* (2013.01); *H05K 1/111* (2013.01); *H05K 3/222* (2013.01); *G06F 2203/04112* (2013.01); *H05K 1/0306* (2013.01); *Y02P 70/611* (2015.11)

(58) Field of Classification Search
CPC ... H05K 1/0296; H05K 1/0306; H05K 3/4685
See application file for complete search history.

(56) References Cited

U.S. PATENT DOCUMENTS

| | | | | |
|---|---|---|---|---|
| 3,337,426 | A | * | 8/1967 | Celto ..................... C23C 14/04 |
| | | | | 174/256 |
| 6,188,391 | B1 | | 2/2001 | Seely et al. |
| 6,310,299 | B1 | * | 10/2001 | Kim ................... G02F 1/13452 |
| | | | | 174/256 |
| 6,801,289 | B2 | * | 10/2004 | Ichioka ................ G02F 1/1345 |
| | | | | 349/149 |
| 7,148,427 | B2 | | 12/2006 | Aruga et al. |
| 7,239,153 | B2 | | 7/2007 | Nysaether |
| 8,179,381 | B2 | * | 5/2012 | Frey ....................... G06F 3/044 |
| | | | | 178/18.05 |
| 8,300,019 | B2 | | 10/2012 | Elias et al. |
| 8,319,747 | B2 | | 11/2012 | Hotelling et al. |
| 8,330,474 | B2 | | 12/2012 | Vandermeijden |
| 8,541,888 | B2 | | 9/2013 | Choi et al. |
| 8,633,915 | B2 | | 1/2014 | Hotelling et al. |
| 8,704,746 | B2 | * | 4/2014 | Byun ................... G09G 3/3674 |
| | | | | 345/100 |
| 8,715,839 | B2 | | 5/2014 | De Rochemont |

(Continued)

FOREIGN PATENT DOCUMENTS

| | | | | |
|---|---|---|---|---|
| CN | | 102799329 A | * 11/2012 | |
| WO | WO 2012005429 A1 | * 1/2012 | ............. G06F 3/044 |

*Primary Examiner* — Nathan Milakovich
(74) *Attorney, Agent, or Firm* — Osha Liang LLP

(57) ABSTRACT

A chip-on-glass device comprises a chip-on-glass substrate, a metal layer, and a plurality of chip-on-glass connection bumps. The metal layer comprises a plurality of passive jumper routing traces. The plurality of chip-on-glass connection humps is coupled with passive jumper routing traces of the plurality of passive jumper routing traces.

10 Claims, 9 Drawing Sheets

(56) References Cited

U.S. PATENT DOCUMENTS

| | | | |
|---|---|---|---|
| 8,982,310 B2* | 3/2015 | Jamshidi Roudbari | G02F 1/1339 349/110 |
| 9,024,910 B2* | 5/2015 | Stephanou | G06F 3/0414 345/173 |
| 9,052,789 B2* | 6/2015 | Yau | H05K 1/0289 |
| 9,081,453 B2* | 7/2015 | Bulea | G06F 3/044 |
| 9,081,457 B2* | 7/2015 | Solven | G06F 3/044 |
| 9,118,324 B2 | 8/2015 | Choi et al. | |
| 9,317,165 B2* | 4/2016 | Hotelling | G06F 3/044 |
| 2002/0089634 A1* | 7/2002 | Aruga | G02F 1/1345 349/149 |
| 2005/0089200 A1* | 4/2005 | Nysaether | G06K 9/0002 382/124 |
| 2007/0003781 A1* | 1/2007 | de Rochemont | B82Y 30/00 428/615 |
| 2009/0091551 A1* | 4/2009 | Hotelling | G06F 3/0416 345/174 |
| 2010/0013800 A1 | 1/2010 | Elias et al. | |
| 2010/0149108 A1 | 6/2010 | Hotelling et al. | |
| 2010/0201647 A1 | 8/2010 | Verweg | |
| 2010/0258360 A1 | 10/2010 | Yilmaz | |
| 2011/0048812 A1 | 3/2011 | Yilmaz | |
| 2011/0089576 A1* | 4/2011 | Choi | G02F 1/1345 257/777 |
| 2011/0248972 A1* | 10/2011 | Ahn | G09G 3/3648 345/206 |
| 2012/0319966 A1* | 12/2012 | Reynolds | G06F 3/041 345/173 |
| 2013/0285945 A1* | 10/2013 | Oh | G06F 3/0416 345/173 |
| 2013/0335123 A1* | 12/2013 | Choi | H03K 17/165 327/109 |
| 2014/0084992 A1* | 3/2014 | Chen | G06F 3/0412 327/517 |
| 2014/0125645 A1* | 5/2014 | Ghaderi | G09G 3/006 345/211 |
| 2014/0253459 A1* | 9/2014 | Koo | G06F 3/0416 345/173 |
| 2016/0018094 A1* | 1/2016 | Bower | G09G 3/32 362/382 |
| 2016/0037631 A1* | 2/2016 | Payne | H05K 1/0306 174/251 |
| 2016/0103531 A1* | 4/2016 | Kimura | G02F 1/13338 345/174 |

\* cited by examiner

400

Section A - A

UTILIZING CHIP-ON-GLASS TECHNOLOGY TO JUMPER ROUTING TRACES

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones and tablet computers). Such touch screen input devices are typically superimposed upon or otherwise collocated with a display of the electronic system.

SUMMARY

A chip-on-glass device comprises a chip-on-glass substrate, a metal layer, and a plurality of chip-on-glass connection bumps. The metal layer comprises a plurality of passive jumper routing traces. The plurality of chip-on-glass connection bumps is coupled with passive jumper routing traces of the plurality of passive jumper routing traces.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments and, together with the Description of Embodiments, serve to explain principles discussed below, where like designations denote like elements.

DESCRIPTION OF EMBODIMENTS

The following Description of Embodiments is merely provided by way of example and not of limitation. Furthermore, there is no intention to be bound by any expressed or implied theory presented in the preceding Background, Summary, or Brief Description of Drawings or the following Description of Embodiments.

Overview of Discussion

Herein, various embodiments are described that provide chip-on-glass devices, single-layer capacitive sensors, and input devices that facilitate improved usability. In various embodiments described, herein, the input device may be a capacitive sensing input device. Embodiments associated with single-layer capacitive sensors and capacitive sensing input devices which include single-layer capacitive sensors are described. Capacitive sensing input devices which utilize multiplexed channels to reduce the number of channels and utilize receiver electrodes and transmitter electrodes disposed in a common layer with one another often require jumpers somewhere to route transmitter traces and receiver traces from the channels to the sensor electrodes.

Discussion begins with a description of an example input device with which or upon which various embodiments described herein may be implemented. An example sensor substrate that includes a sensing portion and a routing portion is described. An example chip-on-glass device that can be used to jumper routing traces in the routing portion is depicted and described. A single-layer capacitive sensor and input device are described, and, each includes a sensor substrate and a chip-on-glass device used to jumper routing traces. A chip-on glass circuit with at least one active component is described. And finally, a single-layer capacitive sensor and an input device which utilize each a plurality of chip-on-glass devices are described.

Example Input Device

Figure 1:
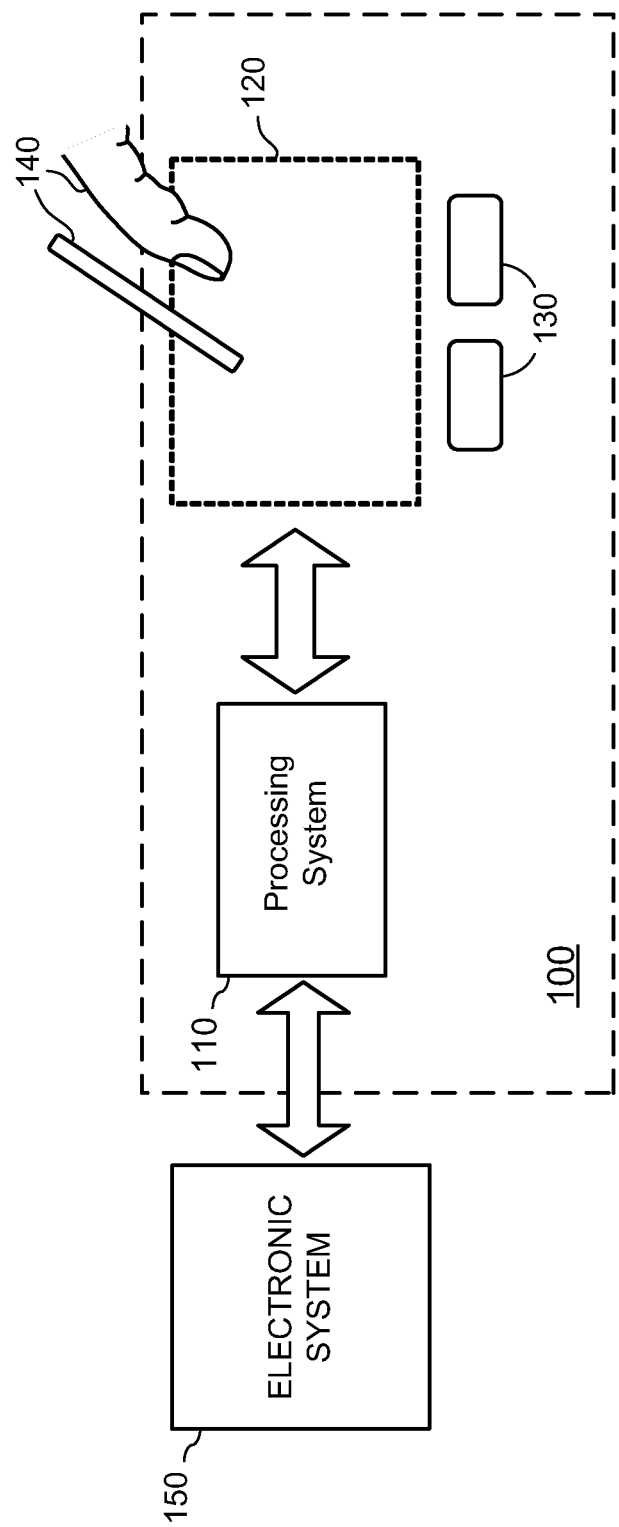
FIG. 1 is a block diagram of an example input device, in accordance with embodiments.

Turning now to the figures, FIG. 1 is a block diagram of an exemplary input device 100, in accordance with various embodiments. Input device 100 may be configured to provide input to an electronic system/device. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic systems could be a host or a slave to the input device.

Input device 100 can be implemented as a physical part of the electronic systems, or can be physically separate from the electronic system. As appropriate, input device 100 may communicate with parts of the electronic system using any one or more of the following: buses, networks, and other wired or wireless interconnections. Examples include, but are not limited to: Inter-Integrated Circuit (I2C), Serial Peripheral Interface (SPI), Personal System 2 (PS/2), Universal Serial Bus (USB), Bluetooth®, Radio Frequency (RF), and Infrared Data Association (IrDA).

In FIG. 1, input device 100 is shown as a proximity sensor device (also often referred to as a "touchpad" or a "touch sensor device") configured to sense input provided by one or more input objects 110 in a sensing region 120. Example input objects include fingers and styli, as shown in FIG. 1.

Sensing region 120 encompasses any space above, around, in and/or near input device 100, in which input device 100 is able to detect user input (e.g., user input provided by one or more input objects 140). The sizes, shapes, and locations of particular sensing regions may vary widely from embodiment to embodiment. In some embodiments, sensing region 120 extends from a surface of input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of input device 100, contact with an input surface (e.g., a touch surface) of input device 100, contact with an input surface of input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, sensing region 120 has a rectangular shape when projected onto an input surface of input device 100.

Input device 100 may utilize any combination of sensor components and sensing technologies to detect user input in sensing region 120. Input device 100 comprises one or more sensing elements for detecting user input. As a non-limiting example, input device 100 may use capacitive techniques.

Some implementations are configured to provide images that span one, two, three, or higher dimensional spaces. Some implementations are configured to provide projections of input along particular axes or planes.

In some capacitive implementations of input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field Bear the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Collectively transmitters and receivers may be referred to as sensor electrodes or sensor elements. Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive. In some embodiments, one or more receiver electrodes may be operated to receive a resulting signal when no transmitter electrodes are transmitting (e.g., the transmitters are disabled). In this manner, the resulting signal represents noise detected in the operating environment of sensing region 120.

In FIG. 1, a processing system 110 is shown as part of input device 100. Processing system 110 is configured to operate the hardware of input device 100 to detect input in sensing region 120. Processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, processing system 110 also comprises electronically-readable instructions, such as firmware code, software code, and/or the like. In some embodiments, components composing processing system 110 are located together, such as near sensing element(s) of input device 100. In other embodiments, components of processing system 110 are physically separate with one or more components close to sensing element(s) of input device 100, and one or more components elsewhere. For example, input device 100 may be a peripheral coupled to a desktop computer, and processing system 110 may comprise software configured to run on a central processing unit of the desktop computer and one or more ICs (perhaps with associated firmware) separate from the central processing unit. As another example, input device 100 may be physically integrated in a phone, and processing system 110 may comprise circuits and firmware that are part of a main processor of the phone. In some embodiments, processing system 110 is dedicated to implementing input device 100. In other embodiments, processing, system 110 also performs other functions, such as operating display screens, driving haptic actuators, etc.

Processing system 110 may be implemented as a set of modules that handle different functions of processing system 110. Each module may comprise circuitry that is a part of processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, processing system 110 responds to user input (or lack of user input) in sensing region 120 directly by causing one or more actions. Example actions include changing operation modes, as well as GUI actions such as cursor movement, selection, menu navigation, and other functions. In some embodiments, processing system 110 provides information about the input (or lack of input) to some part of the electronic system (e.g., to a central processing system of the electronic system that is separate from processing system 110, if such a separate central processing system exists). In some embodiments, some part of the electronic system processes information received from processing system 110 to act on user input, such as to facilitate a full range of actions, including mode changing actions and GUI actions.

For example, in some embodiments, processing system 110 operates the sensing element(s) of input device 100 to produce electrical signals indicative of input (or lack of input) in sensing region 120. Processing system 110 may perform any appropriate amount of processing on the electrical signals in producing the information provided to the electronic system. For example, processing system 110 may digitize analog electrical signals obtained from the sensor electrodes. As another example, processing system 110 may perform filtering or other signal conditioning. As yet another example, processing system 110 may subtract or otherwise account for a baseline, such that the information reflects a difference between the electrical signals and the baseline. As yet further examples, processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, input device 100 is implemented with additional input components that are operated by processing system 110 or by some other processing system. These additional input components may provide redundant functionality for input in sensing region 120, or some other functionality. FIG. 1 shows buttons 130 near sensing region 120 that can be used to facilitate selection of items using input device 100. Other types of additional input components include sliders, balls, wheels, switches, and the like. Conversely, in some embodiments, input device 100 may be implemented with no other input components.

In some embodiments, input device 100 may be a touch screen, and sensing region 120 overlaps at least part of an active area of a display screen. For example, input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. Input device 100 and the display screen may share physical elements. For example, some embodiments may utilize some of the same electrical components for displaying and sensing. As another example, the display screen may be operated in part or in total by processing system 110.

Example Single-Layer Capacitive Sensors

Figure 2:
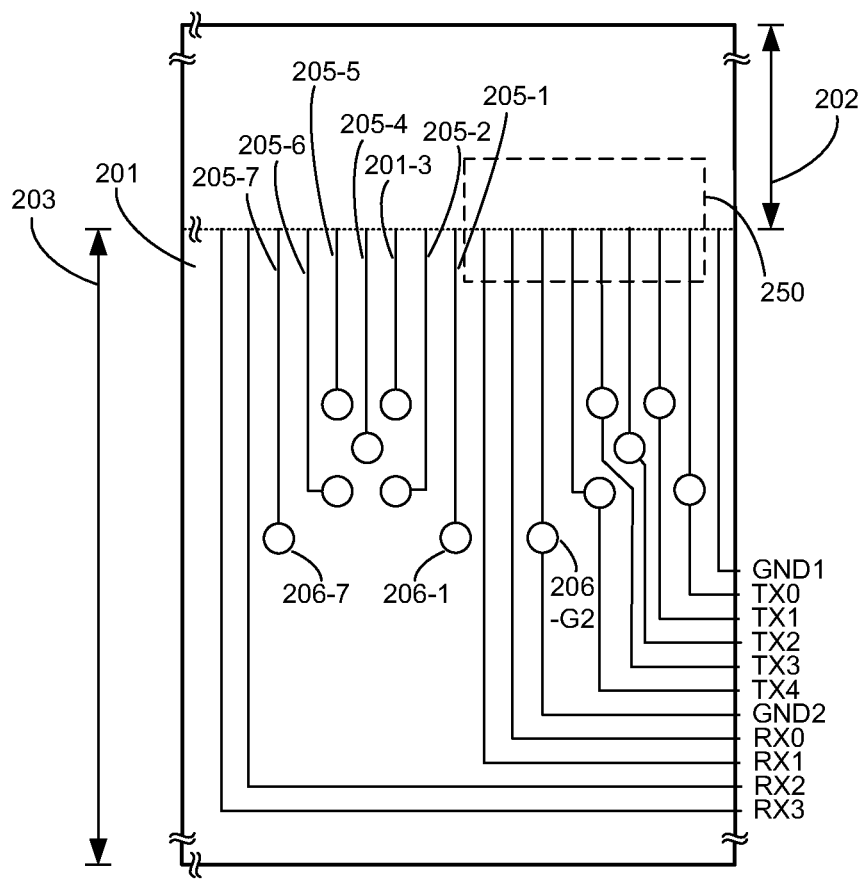
FIG. 2 illustrates a plan view of an example sensor substrate which includes a sensor portion and a routing portion, according to an embodiment.

FIG. 2 illustrates a plan view of an example sensor substrate 201 which includes a sensor portion 202 and a routing portion 203, according to an embodiment. Sensor portion 202 includes a plurality of sensor electrodes that are utilized to project a sensing region 120. As will be further described, sensor portion 202 includes a plurality of traces and sensor electrodes that are formed of conductive material that is disposed entirely in a single common layer with one another and with routing traces that are disposed in routing portion 203. In some embodiments, the conductive material comprises a metal mesh. The metal mesh may be made of aluminum, aluminum alloy, molybdenum, copper, silver, or other metal or combination of metals. As depicted, the routing portion includes a plurality of routing traces (GND1, TX0, TX1, TX2, TX3, TX4, GND2, RX0, RX1, RX2, and RX3) that are have an uninterrupted route through routing portion 203 to couple with sensor portion 202; and a plurality of routing traces (205-1, 205-2, 205-3, 205-4, 205-5, 205-6, and 205-7) that have an interrupted or partial path through muting portion 203. The uninterrupted routing traces couple signals from between a processing system, such as processing system 110, and sensor portion 202 by traversing uninterrupted, through routing portion 203; while the partial routing traces require some form of jumpering into an interior portion of routing portion 203 in order to convey signals between a processing system, such as processing system 110, and sensor portion 202. Detail 250, which is encompassed within a dashed box is illustrated in enlarged detail in FIG. 3. As is illustrated, a number of the routing traces (GND1, TX0, GND1, TX0, TX1, TX2, TX3, TX4, GND2, 205-1, 205-2, 205-3, 205-4, 205-5, 205-6, and 205-7) terminate in pad or are configured with an inline pad which facilitates coupling to a chip-on-glass connection bump. In FIG. 2, three of these pads are labeled: pad 206-1 (associated with routing trace 205-1); pad 206-6 (associated with routing trace 206-6); and pad 206-G2 (associated with routing trace GND2).

Figure 3:
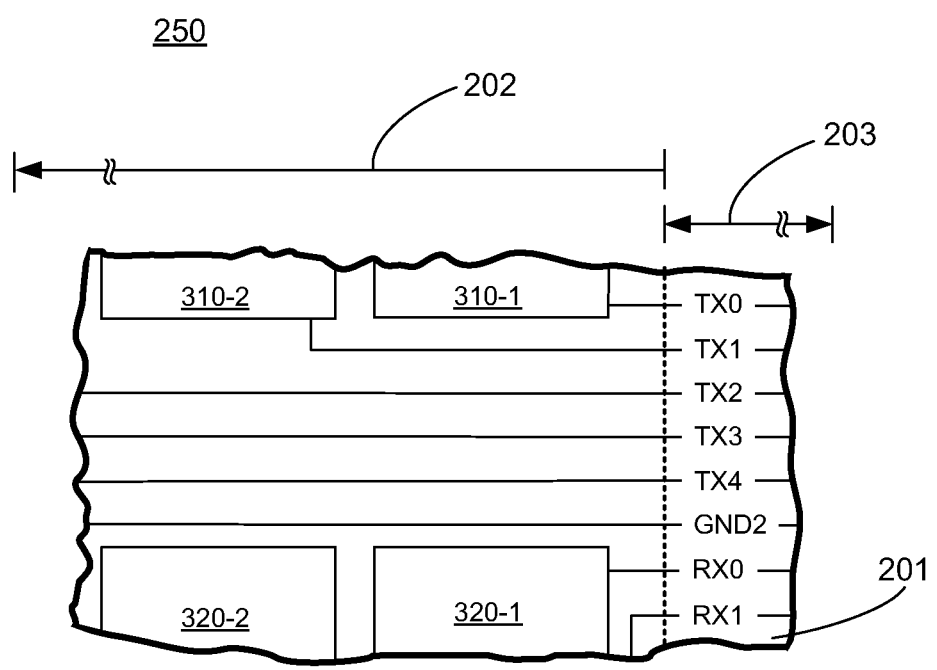
FIG. 3 illustrates an enlarged detail of a portion of FIG. 2, according to an embodiment.

FIG. 3 illustrates an enlarged detail 250 of a portion of FIG. 2, according to an embodiment. For purposes of clarity of illustration and description, a portion of a non-limiting simple sensor electrode pattern is illustrated in a top plan view; however, it is appreciated that numerous other sensor electrode patterns may be employed. As can be seen, sensor portion 202 includes a plurality of transmitter electrodes 310 and a plurality of receiver electrodes 320 that are disposed in a single layer with one another. The illustrated sensor electrodes, along with others, form a pattern which may be utilized in a proximity sensor to generate all or part of the sensing region 120 of a input device 100, according to various embodiments. Input device 100 is configured as a capacitive input device when utilized with a capacitive sensor electrode pattern. Routing traces bearing a "TX" designation typically convey a transmitter signal from a processing system, and may be referred to as transmitter electrode traces. Routing traces bearing an "RX" designation typically convey a received resulting signal from a receiver electrode to a processing system, and may be referred to as receiver electrode traces. As is illustrated a plurality of receiver electrode traces and a plurality of transmitter electrode traces are disposed on substrate 201. By "on substrate 201" what is meant is that the routing traces are disposed directly on substrate 201 or upon a layer that is disposed upon or layered above or below one or more other layers that are disposed upon substrate 201. In the embodiment depicted in detail 250, transmitter electrode 310-1 is coupled with routing trace TX0, while transmitter electrode 310-2 is coupled with routing trace TX1. In the embodiment depicted in detail 250, receiver electrode 320-1 is coupled with routing trace RX0, while routing electrode 320-2 is coupled with receiver trace RX1.

Figure 4:
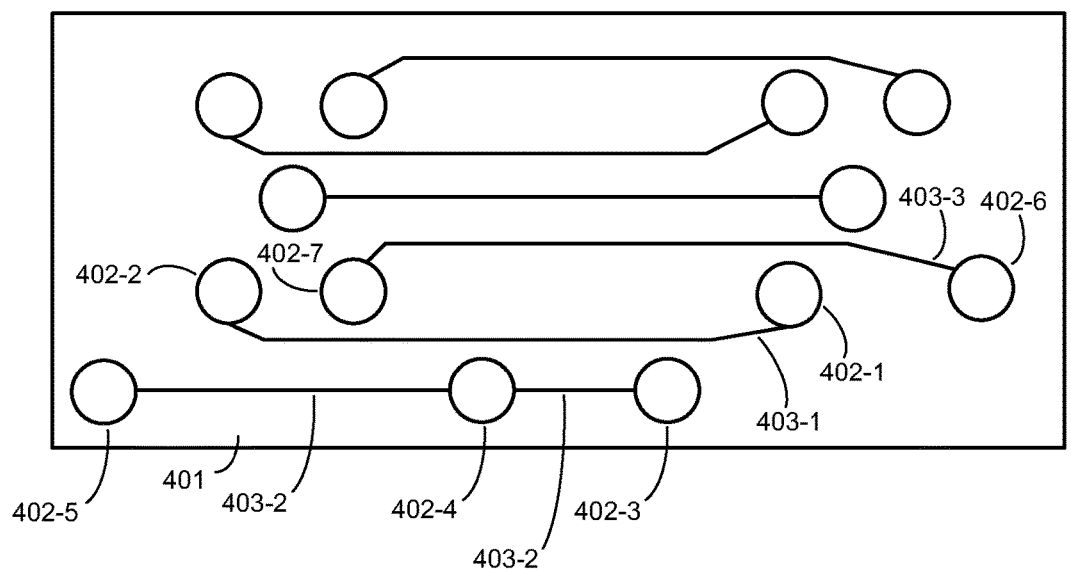
FIG. 4 illustrates a plan view of an example chip-on-glass device, according to an embodiment.

FIG. 4 illustrates a plan view of an example chip-on-glass device 400, according to an embodiment. Chip-on-glass device 400 includes a substrate 401, at least one passive jumper routing trace 403, and a plurality of chip-on-glass connection bumps 402.

Substrate 401 may be at least partially transparent in some embodiments (and is in FIG. 4). In various embodiments, substrate 401 may be made from a semiconducting material, such as silicon crystal, or from an insulating material, such as glass or ceramic.

Passive jumper routing traces 403 are metal traces disposed proximate to substrate 401. By "proximate to" what is meant is that passive jumper routing traces are either disposed directly on substrate 401 or on a layer of material that is disposed upon or layered above or below one or more other layers that are disposed upon substrate 401.

Connection bumps 402 are conductive bumps which are bonded to portions of passive jumper routing traces 403 to enable an electrically conductive connection of the passive jumper routing trace 403 with an entity external to chip-on-glass device 400. Chip-on-glass connection bumps are generally known in the art.

In FIG. 4, a number of the passive jumper routing traces 403 and chip-on-glass connection bumps 402 are labeled, for descriptive and illustrative purposes. For example, in chip-on-glass device 400, chip-on-glass connection bumps 402-1 and 402-2 are conductively coupled with one another by passive jumper routing trace 403-1; chip-on-glass connection bumps 402-3, 402-4, and 402-5 are conductively coupled with one another by passive jumper routing trace 403-2; and chip-on-glass connection bumps 402-6 and 402-7 are conductively coupled with one another by passive juniper routing trace 403-3.

In some embodiments, chip-on-glass device 400 may include only a single layer of metal, and that single layer of metal is utilized to form passive jumper routing traces 403. The metal passive jumper routing traces 403 and chip-on-glass connection bumps 402 are used to passively multiplex routing traces. "Passively multiplexing" describes causing a routing trace to branch from a first routing trace branch to multiple routing trace branches without the use of active switching devices such as logic, transistors, or the like. For example, as will be further illustrated and described, a single routing trace on substrate 201 may be coupled with a chip-on-glass connection bump 402 and then jumpered or else jumpered and passively multiplexed by metal traces 403.

Passive jumper routing traces 403 are passive in nature as they do not require any active components in a chip-on-glass device to carry out their function. Active components include components such as processors, memory, or transistors. For example, transistors, which might be used to open/close/select/deselect pathways formed by passive jumper routing traces 403 are not included in some chip-on-glass device embodiments. Instead, in some embodiments, passive jumper routing traces 403 are simply metal traces that are disposed in the same single layer with one another and accomplish jumpering and/or jumpering and passive multiplexing without use of active components. Thus, sonic embodiments, a chip-on-glass device, such as circuit 400, includes no active components such as transistors, disposed on substrate 401 or on a layer that is disposed upon or layered, above/below substrate 401. In addition to not including active components, sonic embodiments of chip-on-glass devices described herein do not include either passive components (e.g., intentionally created resistors, inductors and/or capacitors) or electro-mechanical components (e.g., components with moving parts). It is appreciated that some passive components such as capacitors may be unintentionally created simply due to the layering of conductors and insulators, and that such unintentionally created passive components are differentiated from those that are intentionally created and disposed as part of a chip-on-glass device.

Figure 7:
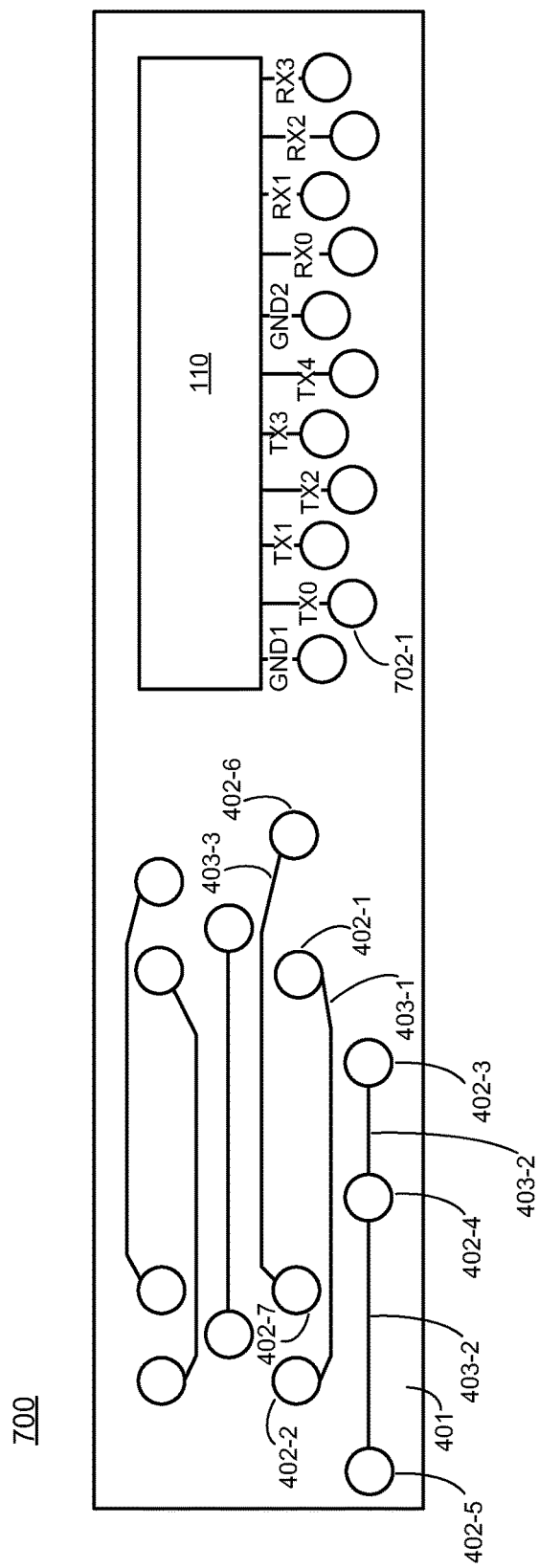
FIG. 7 illustrates a plan view of an example chip-on-glass device, according to an embodiment.

In some embodiments, a chip-on-glass device does include at least one active component such as a transistor, disposed on substrate 401 or on a layer that is disposed upon or layered above/below substrate 401. FIG. 7, for example, illustrates a chip-on-glass device 700 which includes processing system 110 (which may be in the form of an ASIC).

In some embodiments, a chip-on-glass device may include more than one layer of metal and the additional layer(s) of metal may be used to form additional passive jumper routing traces and/or passive components such as capacitors. It is appreciated that one of skill in the art should be well acquainted with techniques used to create a chip-on-glass device that includes multiple layers of metal and/or passive components. In some embodiments, a chip-on-glass device as described herein may include passive jumper routing traces 403, one or more intentionally created passive components, and no active components. In some embodiments, a chip-on-glass device as described herein may include passive juniper routing traces 403, one or more intentionally created passive components, and one or more active components. In some embodiments, a chip-on-glass device as described herein may include passive jumper routing traces 403, no intentionally created passive components, and one or more active components.

Figure 5:
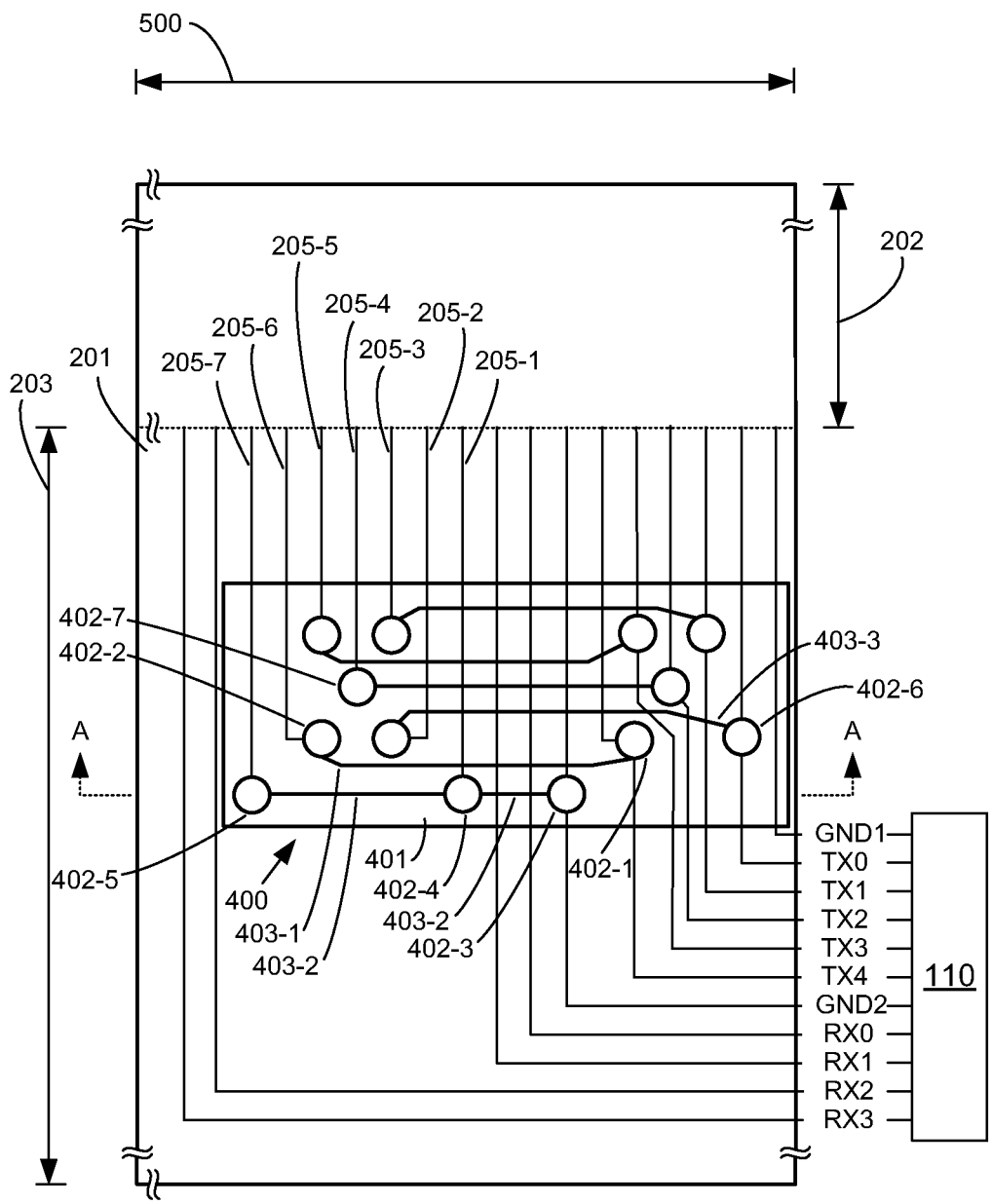
FIG. 5 illustrates a view of an example capacitive sensing input device, according to an embodiment.
Figure 6:
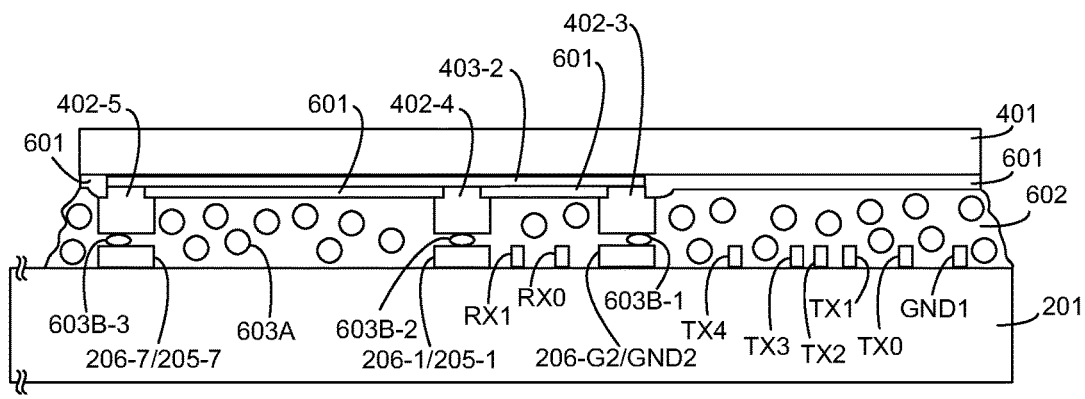
FIG. 6 illustrates a section view of a portion of FIG. 5, according to an embodiment.

FIG. 5 illustrates a plan view of an example capacitive sensing input device 100A, according to an embodiment. Markings for a cross-section A-A are shown, and this cross-section is illustrated in FIG. 6. Capacitive sensing input device 100A includes a processing system 110 and single-layer capacitive sensor 500 (substrate 201 (with its single layer of metal) and chip-on-glass device 400). In some embodiments, processing system 110 may be coupled to substrate 201 with a flex tail and Anisotropic Conductive Film (ACF) bond or other means which are not illustrated.

In FIG. 5, chip-on-glass device 400 has been bonded to substrate 201 and selected routing traces (TX0, TX1, TX2, TX3, TX4, GND2, 205-1, 205-2, 205-3, 205-4, 205-5, 205-6, and 205-7). Chip-on-glass device 400 operates to passively jumper and/or passively jumper and passively multiplex routing traces. This eliminates the requirement for additional layers and/or vias associates with substrate 201. This also operates to limit the width of routing portion 203 (in the direction of the bracketed arrows), as repeated routings of the same traces such as TX0, TX1, TX2, TX3, and TX4 that would increase the width of routing portion 203 can instead be jumpered through chip-on-glass device 400, as required, rather than being repetitively routed across the entirety of routing portion 203. As can be seen, a plurality of muting traces, such are receiver traces RX0, RX1, RX2 and RX3 run uninterrupted beneath chip-on-glass substrate 401. It should be appreciated that transmitter traces, ground traces or other routing traces may similarly pass beneath chip-on-glass substrate 401 in an uninterrupted fashion in some embodiments.

FIG. 6 illustrates a section view A-A of a portion of FIG. 5, according to an embodiment. Section A-A illustrates an example of the bonding of a chip-on-glass device, such as chip-on-glass device 400, to routing traces disposed on a substrate, such as substrate 201. While not evident from the scale of cross-section A-A, a chip-on-glass, such as chip-on-glass 400, is typically in the vicinity of 100-500 microns thick.

In the portion illustrated in cross-section A-A, chip-on-glass device 400 includes: substrate 401; passive jumper routing trace 403-2; chip-on-glass connection bumps 402-3, 402-4, and 402-5; and insulating layer 601. Chip-on-glass connection bumps 402-3, 402-4, and 402-5 are conductively coupled with passive jumper routing trace 403-2. Insulating layer 601 is composed of an insulating material which may be a passivation layer. In one embodiment, insulating layer 601 comprises silicon nitride; however, in other embodiments other insulating materials may be used in insulating layer 601 or in other insulating layers. It is appreciated that if multiple metal layers were utilized, they would be separated by insulating layers similar to insulating layer 601, except in regions where they were designed to be conductively coupled with one another.

In the portion illustrated in cross-section A-A, substrate 201 includes uninterrupted routing traces GND1, TXO, TX1, TX2, TX3, TX4, and TX5 and interrupted routing traces 205-1 and 205-7 which are disposed thereon. Although not depicted, it some embodiments there may be one or more layers disposed between these routing traces and substrate 201.

Chip-on-glass device 400 is bonded to substrate 201 and selected routing traces thereon through the use of Anisotropic Conductive Film (ACF) 601. ACF is well known in the art and can be thought of as being similar to an epoxy that also includes electrically conductive beads 603. An ACF bonding can be accomplished with curing time, the application of pressure (pressing chip-on-glass device 400 into substrate 201), the application of heat, or some combination, as is well known in the art. During the ACF bonding, some conductive beads such as 603A do not conductively couple components, while other conductive beads such as 603B become compressed between a routing trace and a chip-on-glass connection bump 402 and conductively couple the two together. As depicted in cross-section A-A, conductive bead 603B-1 conductively couples pad 206-02 of routing trace GND2 with chip-on-glass connection bump 402-3; conductive bead 603B-2 conductively couples pad 206-1 of routing trace 205-1 with chip-on-glass connection bump 402-5; and conductive bead 603B-3 conductively couples pad 206-7 of routing trace 205-7 with chip-on-glass connection bump 402-5. In this manner, routing trace GND2 is both jumpered by and passively multiplexed (to routing trace 205-1 and 205-7) by chip-on-glass device 400.

FIG. 7 illustrates a plan view of an example chip-on-glass device 700, according to an embodiment. Chip-on-glass device 700 includes at least one active component in the form of processing system 110 (which may be an ASIC) disposed thereon. Outputs from processing system 110 are depicted as being coupled with chip-on-glass connection bumps. For example, TX0 is illustrated as being coupled with chip-on-glass connection bump 701-1. In other embodiments, one or more of the outputs of processing system 110 may be coupled with a chip-on-glass connection bump, such as chip-on-glass connection bump 402-6, via a metal routing trace disposed within chip-on-glass device 700.

Figure 8:
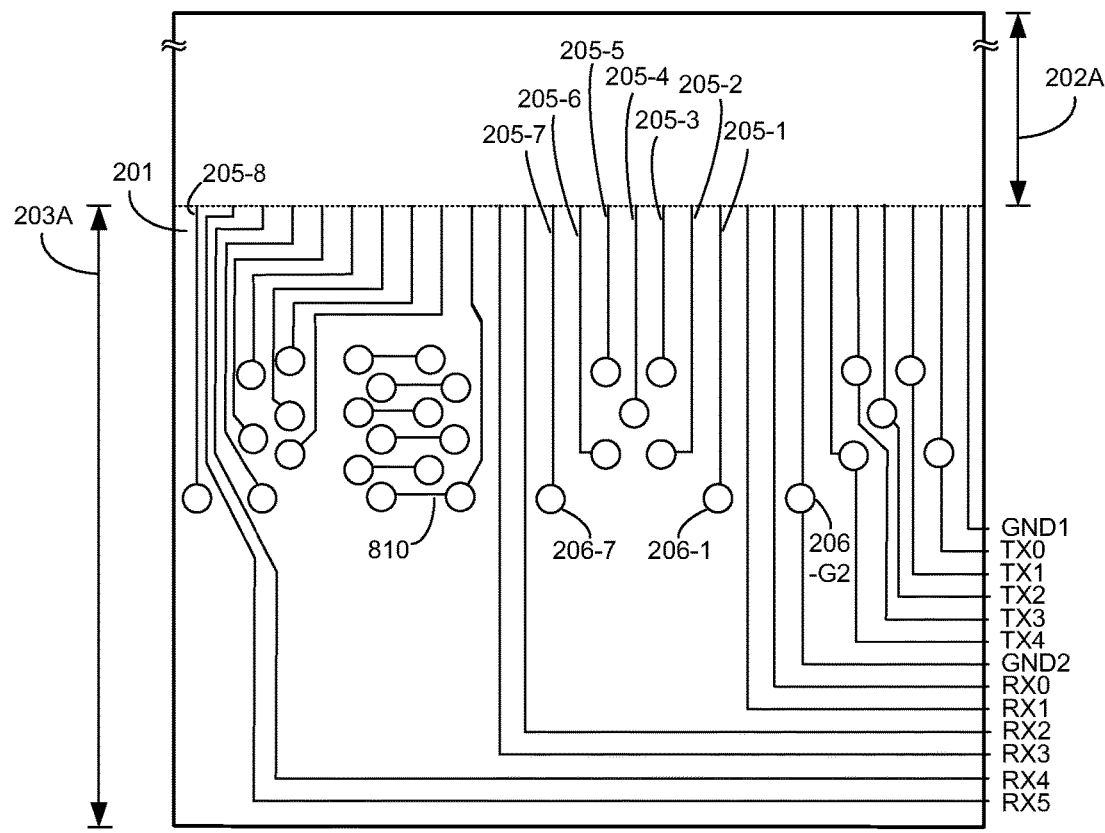
FIG. 8 illustrates a plan view of an example sensor substrate which includes a sensor portion and a routing portion, according to an embodiment.

FIG. 8 illustrates a plan view of an example sensor substrate 201 which includes a sensor portion 202A and a routing portion 203A, according to an embodiment. Sensor portion 202A is similar to sensor portion 202 illustrated in FIG. 2 except that it has been expanded leftward (with respect to FIG. 8) such that more is depicted. Similarly, routing portion 203A is similar to routing portion 203 of FIG. 2 except that it has been expanded leftward (with respect to FIG. 8) such that more is depicted. In one embodiment, both sensor electrodes and traces in sensor portion 202A and routing traces in routing portion 203A are disposed in a common single layer. Both sensor electrodes and traces in sensor portion 202A and routing traces in routing portion 203A may comprise a metal mesh, as has previously been described. In FIG. 8, several routing traces such as 810 are depicted which appear to be floating with nothing being coupled to either end. As will become evident, these traces are utilized to couple passive jumper routing traces from a first chip-on-glass device to passive jumper traces on a second chip-on-glass device.

Figure 9:
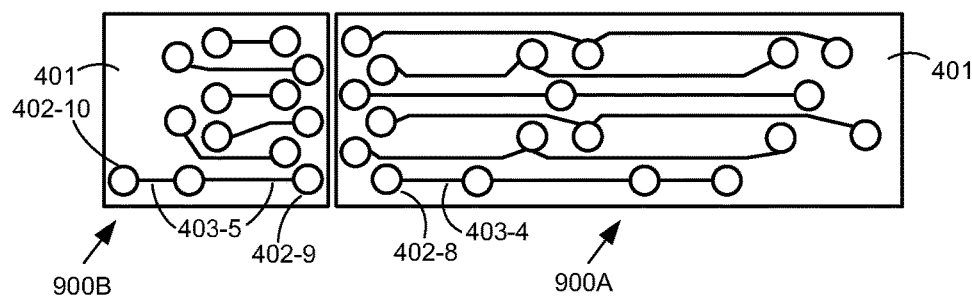
FIG. 9 illustrates a plan view of example chip-on-glass devices, according to an embodiment.

FIG. 9 illustrates a plan view of example chip-on-glass devices 900A and 900B, according to an embodiment. Chip-on-glass device 900A has a similar layout and construction to chip-on-glass device 400, but has been expanded to include additional chip-on-glass connection bumps, such as 402-8, and additional passive jumper routing traces, such as passive jumper routing trace 403-4. As depicted in FIG. 9, passive jumper routing trace 403-4 conductively couples chip-on-glass connection bump 402-7 with chip-on-glass connection bump 402-8. Chip-on-glass device 900B has similar construction but different layout from chip-on-glass devices 400 and 900A. As depicted in FIG. 9, passive jumper routing trace 403-5 is conductively couples chip-on-glass connection bump 402-9 with one or more other chip-on-glass connection bumps (e.g., 402-10) of chip-on-glass device 900B. As will be illustrated, when chip-on-glass devices 900A and 900B are bonded with substrate 201, routing traces such as routing trace 810 conductively couple passive jumper routing traces from chip-on-glass device 900A with those on chip-on-glass device 900B.

Figure 10:
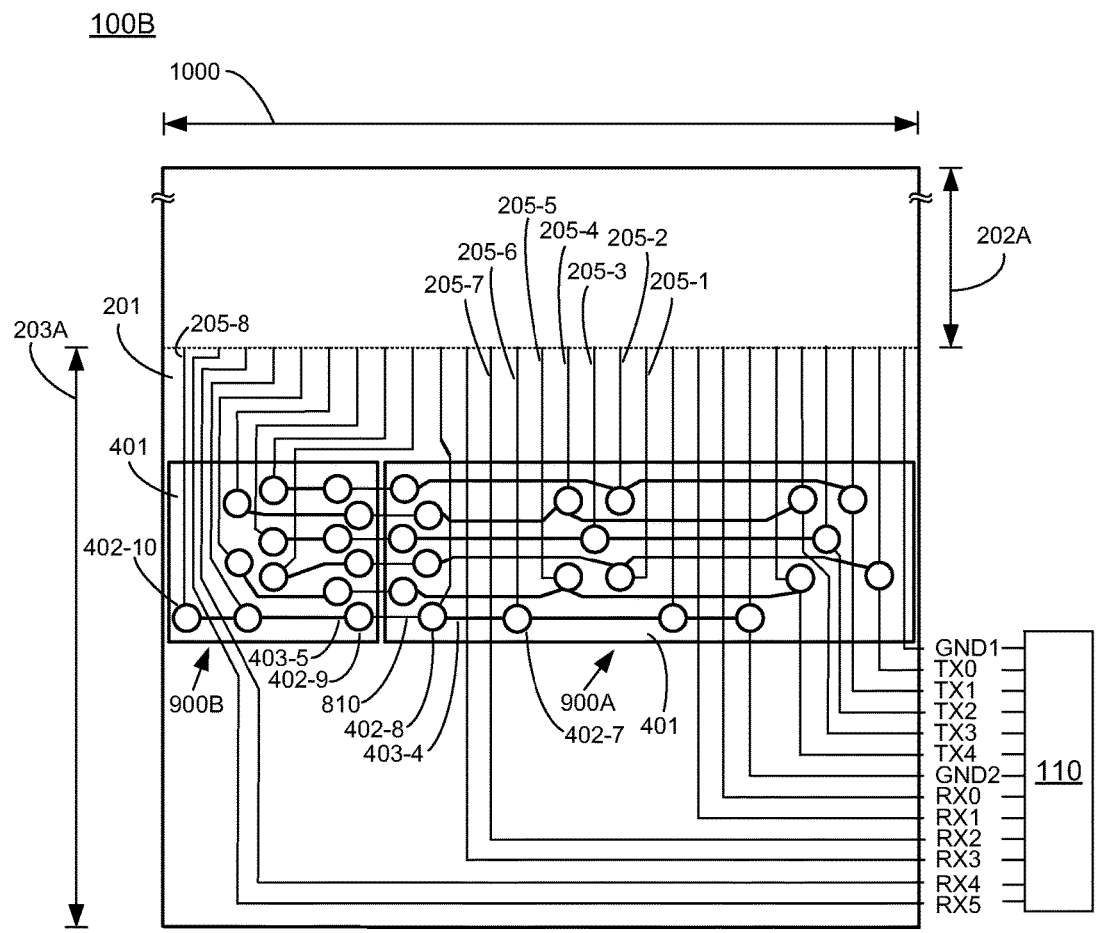
FIG. 10 illustrates a plan view of an example capacitive sensing input device, according to an embodiment.

FIG. 10 illustrates a plan view of an example capacitive sensing input device 100B, according to an embodiment. Capacitive sensing input device 100B includes processing system 110 and single-layer capacitive sensor 1000 (substrate 201 (with its single layer of metal) and chip-on-glass devices 900A and 900B). In some embodiments, processing system 110 may be coupled to substrate 201 with a flex tail and Anisotropic Conductive Film (ACF) bond or other means which are not illustrated.

In FIG. 10, chip-on-glass devices 900A and 900B have been bonded with substrate 201 and selected routing traces (TX0, TX1, TX2, TX3, TX4, GND2, 205-1, 205-2, 205-3, 205-4, 205-5, 205-6, 205-7, 205-8, and 810 among others). Chip-on-glass devices 900A and 900B operate to passively jumper and/or passively jumper and passively multiplex routing traces, as has previously been described with respect to chip-on-glass device 400. Additionally, as a result of bonding to routing traces such as 810, a plurality of passive jumper routing traces of chip of glass circuit 900A are conductively coupled with respective passive jumper routing traces of chip-on-glass device 900B. For example, passive jumper routing trace 403-4 of chip-on-glass device 900A is conductively coupled with passive jumper routing trace 403-5 of chip-on-glass device 900B through chip-on-glass connection bump 402-8, routing trace 810, and chip-on-glass connection bump 402-9. As illustrated, passive jumper routing trace 403-5 is conductively coupled with chip-on-glass connection bump 402-10. Chip-on-glass connection bump 402-10 is bonded with routing trace 205-8 which allows GND2 to be passively tampered and passively multiplexed through both chip-on-glass device 900A and chip-on-glass device 900B and enter sensor portion 202A through routing trace 205-8 and multiple others.

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed.

What is claimed is:

1. A single-layer capacitive sensor comprising:
   a sensor substrate;
   a plurality of receiver electrodes disposed in a first layer above said sensor substrate;
   a plurality of transmitter electrodes disposed in said first layer above said sensor substrate;
   a plurality of routing traces disposed in said first layer above said sensor substrate, wherein at least a first one of said plurality of routing traces is coupled to a receiver electrode of said plurality of receiver electrodes and a different and second one of said plurality of routing traces is coupled to one of said plurality of transmitter electrodes;
   a chip-on-glass device, wherein no active components are disposed within said chip-on-glass device, said chip-on-glass device comprising:
      a chip-on-glass substrate which is a separate entity from said sensor substrate;
      a metal layer comprising a plurality of passive jumper routing traces; and
      a plurality of chip-on-glass connection bumps coupled with passive jumper routing traces of said plurality of passive jumper routing traces; and
   at least one electrical connection between a chip-on-glass connection bump of said plurality of chip-on-glass connection bumps and a transmitter electrode of said plurality of transmitter electrodes or a receiver electrode of said plurality of receiver electrodes.

2. The single-layer capacitive sensor of claim 1, further comprising:
   a plurality of receiver electrode traces disposed on said sensor substrate.

3. The single-layer capacitive sensor of claim 2, wherein at least some said plurality of receiver electrode traces pass beneath said chip-on-glass substrate.

4. The single-layer capacitive sensor of claim 1, wherein said metal layer is the only metal layer of said chip-on-glass device.

5. The single-layer capacitive sensor of claim 1, wherein said metal layer is configured to passively multiplex a single routing trace into a plurality of routing traces.

6. An input device comprising:
   a single-layer capacitive sensor comprising:
      a sensor substrate;
      a plurality of receiver electrodes disposed in a first layer above said sensor substrate; and
      a plurality of transmitter electrodes disposed in said first layer above said sensor substrate;
      a plurality of routing traces disposed in said first layer above said sensor substrate, wherein at least a first one of said plurality of routing traces is coupled to a receiver electrode of said plurality of receiver electrodes and a different and second one of said plurality of routing traces is coupled to one of said plurality of transmitter electrodes;
   a chip-on-glass device, wherein no active components are disposed within said chip-on-glass device, said chip-on-glass device comprising:
      a chip-on-glass substrate which is a separate entity from said sensor substrate;
      a metal layer comprising a plurality of passive jumper routing traces; and
      a plurality of chip-on-glass connection bumps coupled with passive jumper routing traces of said plurality of passive jumper routing traces; and
   at least one electrical connection between a chip-on-glass connection bump of said plurality of chip-on-glass connection bumps and a transmitter electrode of said plurality of transmitter electrodes or a receiver electrode of said plurality of receiver electrodes.

7. The input device of claim 6, further comprising:
   a plurality of receiver electrode traces disposed on said sensor substrate.

8. The input device of claim 7, wherein at least some said plurality of receiver electrode traces pass beneath said chip-on-glass substrate.

9. The input device of claim 6, wherein said metal layer is one of a plurality of metal layers of said chip-on-glass device.

10. The input device of claim 6, wherein said metal layer is configured to passively multiplex a single trace into a plurality of routing traces.

* * * * *

UNITED STATES PATENT AND TRADEMARK OFFICE
CERTIFICATE OF CORRECTION

PATENT NO. : 9,639,214 B2
APPLICATION NO. : 13/947617
DATED : May 2, 2017
INVENTOR(S) : Jim Dunphy et al.

It is certified that error appears in the above-identified patent and that said Letters Patent is hereby corrected as shown below:

On the Title Page

Item [57], Line 5, the word "humps" should read -- bumps --.

Signed and Sealed this
Twenty-fourth Day of October, 2017

Joseph Matal
*Performing the Functions and Duties of the
Under Secretary of Commerce for Intellectual Property and
Director of the United States Patent and Trademark Office*